United States Patent [19]
Edelblute

[11] Patent Number: 5,602,751
[45] Date of Patent: Feb. 11, 1997

[54] METHOD AND APPARATUS FOR SPECTRUM ANALYSIS BY COMPLEX CUMULANTS

[75] Inventor: David J. Edelblute, San Diego, Calif.

[73] Assignee: The United States of America as represented by the Secretary of the Navy, Washington, D.C.

[21] Appl. No.: 395,549

[22] Filed: Feb. 28, 1995

[51] Int. Cl.⁶ .................................................. G01R 23/00
[52] U.S. Cl. ...................................... 364/485; 324/76.19
[58] Field of Search ........................... 324/76.12, 76.19, 324/76.21; 342/192; 364/484, 485, 554, 724.06, 807, 574, 572, 715.01, 728.03, 728.07; 381/71, 94

[56] References Cited

U.S. PATENT DOCUMENTS

| 4,530,076 | 7/1985 | Dwyer . | |
|---|---|---|---|
| 5,018,088 | 5/1991 | Higbie . | |
| 5,091,890 | 2/1992 | Dwyer . | |
| 5,283,813 | 2/1994 | Shalvi . | |
| 5,315,532 | 5/1994 | Comon . | |
| 5,337,053 | 8/1994 | Dwyer | 342/90 |
| 5,343,404 | 8/1994 | Girgis . | |
| 5,459,668 | 10/1995 | Dogan et al. | 364/456 |
| 5,515,300 | 5/1996 | Pierce | 364/572 |
| 5,539,832 | 7/1996 | Weinstein et al. | 381/94 |

*Primary Examiner*—Emanuel T. Voeltz
*Assistant Examiner*—Tony M. Cole
*Attorney, Agent, or Firm*—Harvey Fendelman; Michael A. Kagan; Eric James Whitesell

[57] ABSTRACT

A method for spectrum analysis by complex cumulants comprises the steps of receiving a signal, Fourier transforming the signal to form a series of complex Fourier coefficients, forming complex cumulants from the series of complex Fourier coefficients, and displaying the cumulants in a form wherein the non-Gaussian components of the signal are emphasized.

12 Claims, 3 Drawing Sheets

METHOD AND APPARATUS FOR SPECTRUM ANALYSIS BY COMPLEX CUMULANTS

STATEMENT OF GOVERNMENT INTEREST

The invention described herein may be manufactured and used by or for the Government of the United States for governmental purposes without the payment of any royalties thereon or therefor.

BACKGROUND OF THE INVENTION

The present invention relates to the field of spectral analysis of digitized signals. More particularly, but without limitation thereto, the present invention is directed to a method of detecting non-Gaussian signals in the presence of Gaussian noise using complex cumulants.

Spectrum analysis is among the most commonly used methods to study probabilistic wave forms. Spectrum analysis usually consists of a plot of the second moment of the Fourier transform coefficients vs. frequency of a signal waveform. This type of plot is a measure of the total power or energy of the waveform, but does not take into account the waveform's inherent statistics. Often, the waveform of interest is masked by a significant amount of Gaussian noise. This has stimulated a search for analysis methods which are less sensitive to Gaussian noise, and which emphasize the statistics of the non-Gaussian components of the waveform of interest. It is generally regarded that one of the best approaches is to use techniques designed to discriminate between statistical distributions. If the signal has a different distribution than the noise, then one needs only to look for changes in the statistical distribution. Currently, one of the most useful distribution tests is to compute the cumulants. Cumulants are functions of the moments of the probability distribution function. They have several properties useful for detecting changes of statistical distribution, one of which is that all cumulants above second order are zero for Gaussian signals. Since the power estimates for spectrum analysis may be regarded as second order cumulants, cumulants are a promising candidate for distribution analysis of power spectra.

Unfortunately, there are several impediments to the use of cumulants for signal detection. For example, it has not been clear which cumulants to use. Most research has concentrated on third order cumulants of broadband signals using real variables. Since these signals are relatively weak in broadband power compared to background noise, the cumulants are often Fourier transformed to produce "bi-spectra". However, this leads to a complicated two-dimensional search space in which it is not clear where to look for the signal. Also, it is not clear that a particular Fourier transform will concentrate the signal power at one point so that the signal may be identified. Worse, odd order cumulants are sensitive primarily to asymmetric features of the wave forms. Asymmetric acoustic signals exist, but they tend to be associated with large displacement sources, which may exclude many signals of interest. If real variable cumulants are to be used, they would probably have to be fourth order cumulants, which would further increase the dimension of the search space.

Another difficulty lies in that it has not been clear how to threshold the cumulant estimates. For example, suppose that in the case of noise only, the fourth order cumulant should be zero, but the estimate equals 100. There is no clear theory that says that a value of 100 is small and therefore not significant, or that it is large and almost certainly indicates the presence of a signal.

Yet another problem is that a signal filtered to improve the signal-to-noise ratio often takes the form of Fourier coefficients, which are complex numbers. Most statistical theory, however, is worked out for real numbers. Ordinarily, functions of real variables can be extended as analytic functions of complex variables in a straightforward manner, but probability density functions are not analytic. The appropriate ideas for handling complex random variables are poorly formulated and not widely known. The generalization of most statistical approaches to complex numbers involves subtle difficulties which are not well-known. Unless one is very conscious of the fact that the data is in complex form, the existing literature and practice tend to steer one toward real variables. It is commonly believed that the filtering necessary to observe narrow band signals will, by the central limit theorem, render them Gaussian. In fact, however, the operation of AM radio demonstrates that this does not happen. An AM radio receiver heterodynes a waveform and low pass filters the product to generate the desired signal. A Fourier transform may also be considered as a heterodyne followed by a low pass filter. The filtering operation represented by integration forms a sum of many samples of the heterodyne waveform. The summation is often assumed to produce a Gaussian waveform according to the central limit theorem. However, the filtered signal bandwidth of the AM radio receiver is only a small fraction of the received signal bandwidth, thus the number of samples effectively summed is at least as large as most Fourier transforms. Yet the filtered signal emerges from the AM radio receiver with all of its non-Gaussian features intact.

Methods for using cumulants to analyze random time series have focused on forming time domain cumulant functions, then Fourier transforming these functions. Such methods result in what is often called "high order spectra", "bi-spectra", etc. This approach has had limited success because it is computationally intensive. The data is multi-dimensional and therefore difficult to display, and most of the Fourier transform moments computed are of little interest.

A method for discriminating against non-Gaussian interference to detect Gaussian signals is described in U.S. Pat. No. 4,530,076 to Dwyer, Jul. 16, 1985. Although non-Gaussian signals may be suppressed, no attempt is made to preserve the statistics of the non-Gaussian components in a way which would lend itself to detecting and classifying such signals. The novelty of Dwyer's method is the use of Gaussian kurtosis to form quantile estimates.

U.S. Pat. No. 5,091,890 to Higbie, May 21, 1991 discloses a method for parameter estimation using higher order moments or cumulants in the time domain.

U.S. Pat. No. 5,283,813 to Shalvi et al, Feb. 1, 1994 describes a technique for dealing with effects of a filter using second order cumulants. In this instance, the cumulants are parameters in a system of linear equations rather than variables.

U.S. Pat. No. 5,315,532 to Comon, May 24, 1994 describes a spatial processing technique similar to some beamforming methods. Second order power estimates are formed from cumulants.

U.S. Pat. No. 5,343,404 to Girgis, Aug. 30, 1994 describes a method for analyzing harmonic signals consisting of known sets of harmonics.

While these applications of spectral analysis are some indication of the interest in cumulants, a need still exists for successfully applying complex cumulants to a method of analyzing non-Gaussian signals in the presence of Gaussian noise.

SUMMARY OF INVENTION

The presently preferred embodiment described below of a method for detecting non-Gaussian waveforms in the presence of Gaussian interference is directed to spectrum analysis, however this embodiment of the present invention does not preclude other embodiments and advantages that may exist or become obvious to those skilled in the art.

A method for spectrum analysis by complex cumulants comprises the steps of receiving a signal, Fourier transforming the signal to form a series of complex Fourier coefficients, forming complex cumulants from the series of complex Fourier coefficients, and displaying the cumulants.

An advantage of the present invention is that features of a non-Gaussian waveform may be displayed that were formerly obscured in standard spectral analysis.

A further advantage of the present invention is that non-Gaussian power may be compared with Gaussian power in a simple display that may readily be interpreted.

Another advantage of the present invention is that the displayed cumulant data usually has only two dimensions, simplifying the display requirements.

The features and advantages summarized above in addition to other aspects of the present invention will become more apparent from the description, presented in conjunction with the following drawings.

DESCRIPTION OF THE INVENTION

The following description is not to be taken in a limiting sense, but is presented solely for the purpose of disclosing how the present invention may be made and used. The scope of the invention should be determined with reference to the claims.

Figure 1:
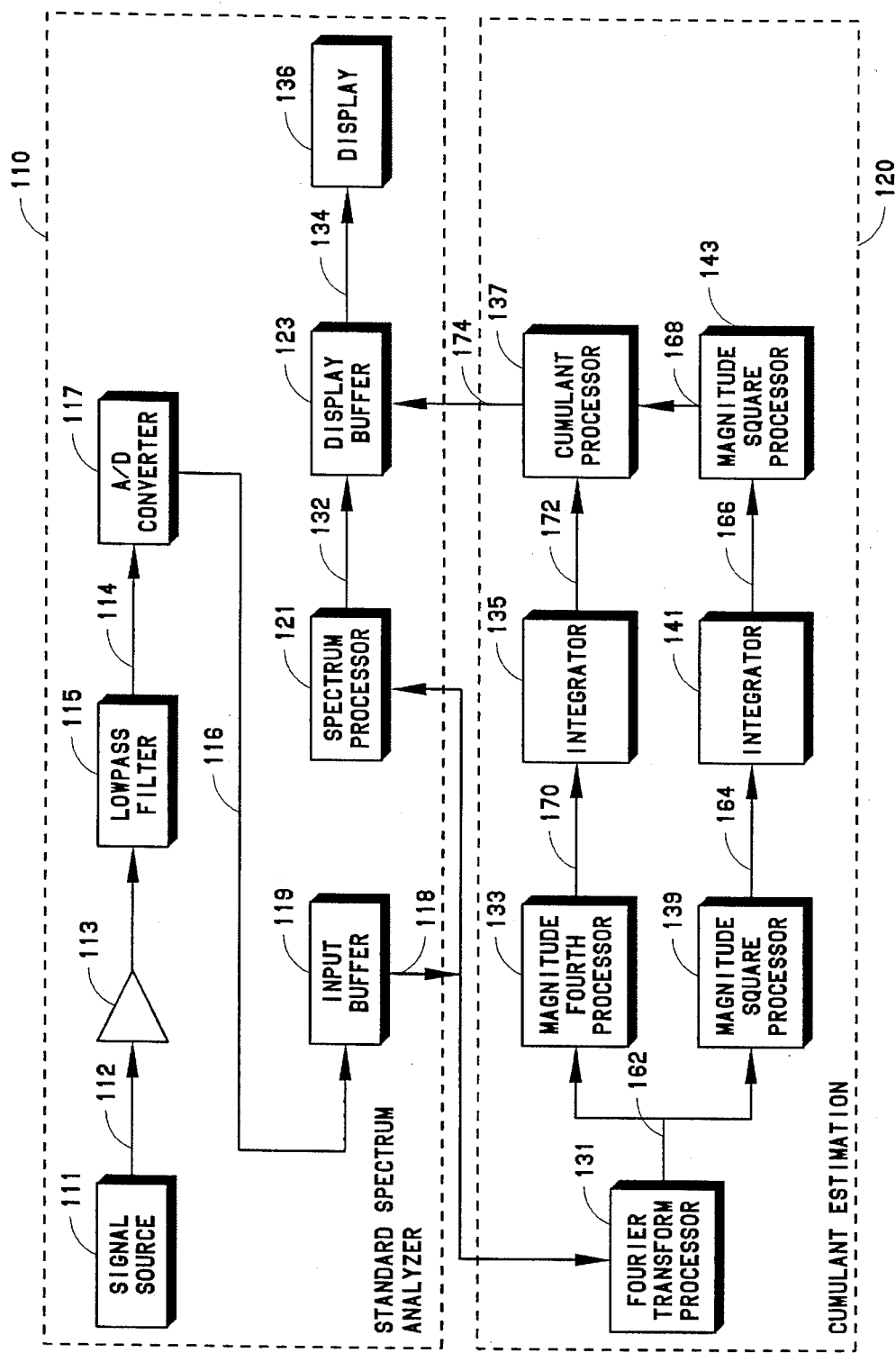
FIG. 1 depicts a spectrum analyzer embodying the method of the present invention.

Referring now to FIG. 1, an example of a structure embodying the method of the present invention for spectrum analysis by complex cumulants comprises a standard spectrum analyzer 110 modified by a cumulant estimator 120 of the present invention.

Spectrum analyzer 110 receives an input signal 112 from a signal source 111 that is buffered by a buffer 113 and lowpass filtered by a lowpass filter 115 to form a filtered signal 114. A/D converter 117 forms a digitized series 116 from filtered signal 114 having an appropriate sample rate. An input buffer 119 collects digitized series 116 to form buffered samples 118. A spectrum processor 121 computes a spectral series 132 from buffered samples 118. Spectral series 132 and a cumulant series 174 are buffered by a display buffer 123 to form display data 134. Display data 134 is displayed by a display 136, typically as a waterfall or A-scan display such as illustrated in FIG. 2.

Still referring to FIG. 1, buffered samples 118 are Fourier transformed by a Fourier transform processor 131 to form a series of complex Fourier coefficients 162. Fourier coefficients 162 are squared by a magnitude square processor 139 to form a magnitude squared series 164. Magnitude squared series 164 is integrated by an integrator 141 to form an integrated magnitude squared series 166. Integrated magnitude squared series 166 is then squared by a second magnitude square processor 143 to form a normalizing series 168.

In parallel with forming normalizing series 168, Fourier coefficients 162 are raised to the fourth power by a magnitude fourth processor 133 to form a magnitude fourth power series 170. Magnitude fourth power series 170 is integrated by a second integrator 135 to form an integrated power series 172. Normalizing series 168 and integrated power series 172 are processed by a cumulant processor 137 to form cumulant series 174.

Figure 2:
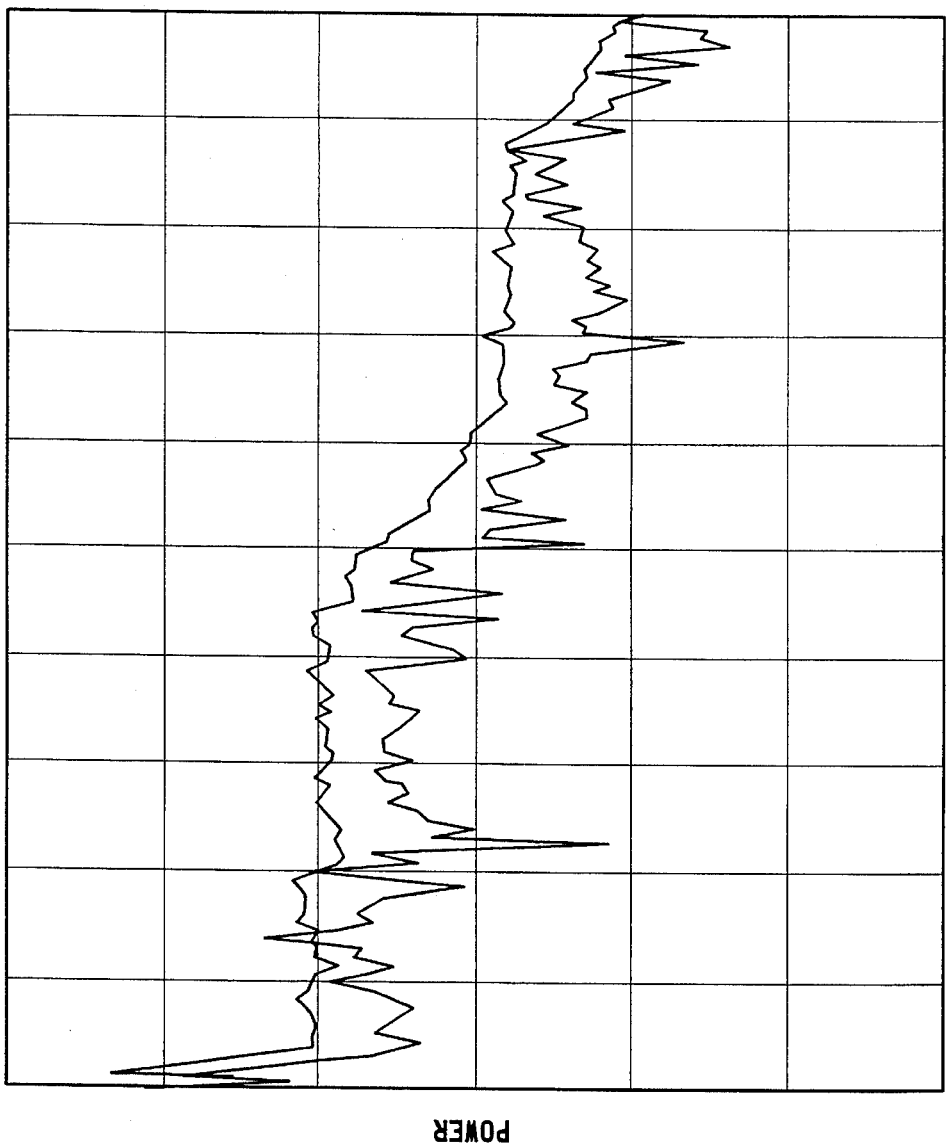
FIG. 2 depicts a format for displaying complex cumulants with a frequency spectrum.
Figure 3:
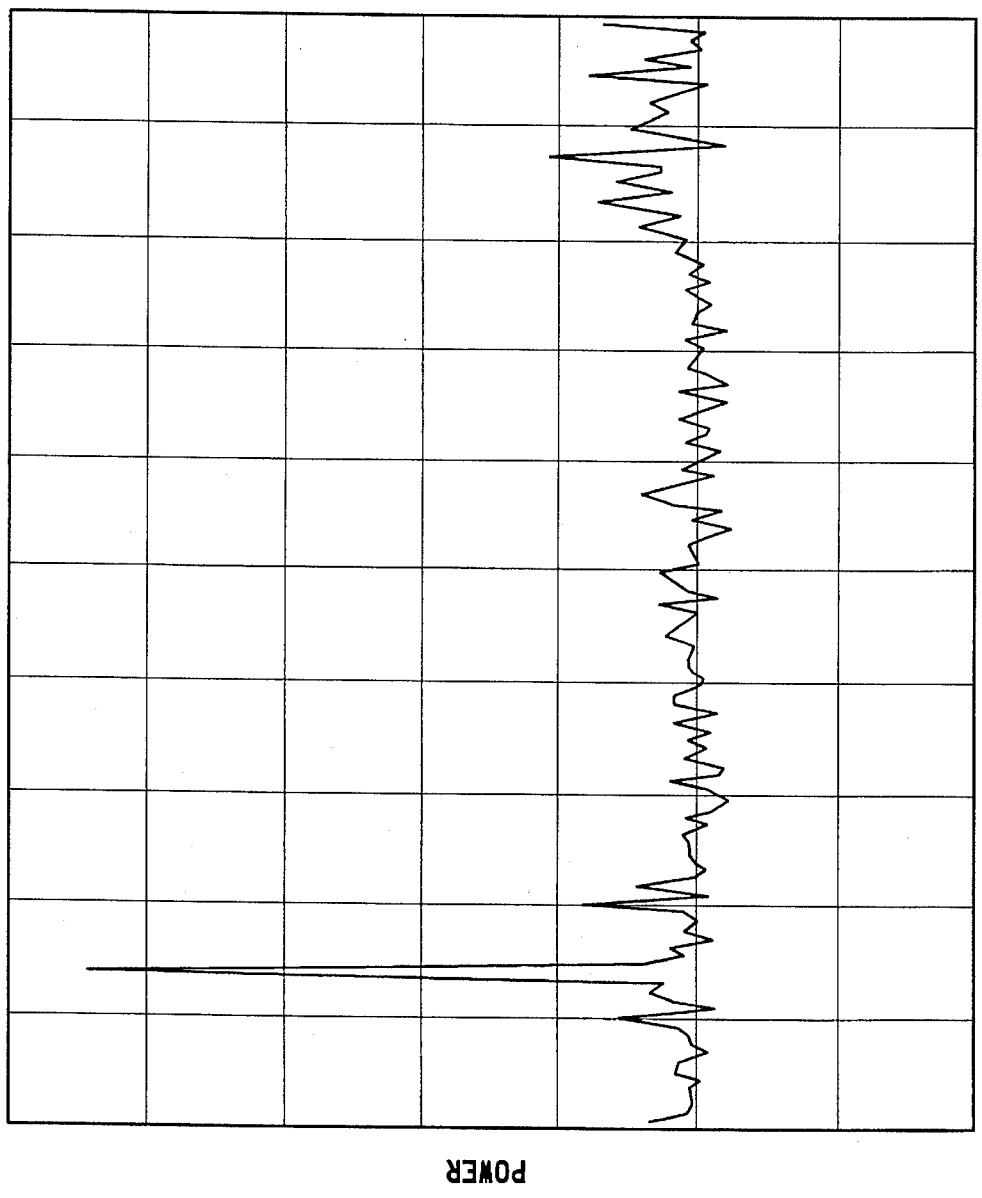
FIG. 3 depicts a second format for displaying complex cumulants as a linear plot of the difference between the plots of FIG. 2 normalized by the square of the spectral power.

In FIG. 2, the magnitudes of the cumulants are displayed on the same scale as the standard frequency spectrum to compare non-Gaussian signal power with total signal power. In FIG. 3, the difference between the frequency spectrum and the magnitudes of the complex cumulants is normalized by the square of the spectrum power and plotted on a linear scale to emphasize the non-Gaussian signal components.

The method of the present invention for spectrum analysis by complex cumulants reverses the usual order of calculations of cumulants. The Fourier transform is performed first, then the cumulants are calculated as a function of frequency. Since complex data is used to form the cumulants, these forms differ from the well-known cumulant forms, which are derived from real variables. The formulas for computing complex cumulants are derived beginning with the Fourier transform $$X_k(j) = \sum_{i=0}^{N-1} x_k(i) e^{-\sqrt{-12\pi ij/N}},$$

where i is the time index of the data stream of buffered samples 118, j is the frequency index of the Fourier coefficients, and k is a sample index of the buffer from which the samples comprising the sequence x(i) are taken. N is the number of time samples used in the low pass filtering part of the Fourier transform. The quotient of the sample rate divided by N defines the frequency resolution of the Fourier transform. A window function may also be used for side lobe control, but is omitted in this example. The usual spectral estimates $$S(j) = \frac{1}{M} \sum_{k=1}^{M} X_k(j)^* X_k(j)$$

suggest the first cumulant $$C4(j) = \frac{1}{M} \sum_{k=1}^{M} |X_k(j)|^4 - \alpha S(j)^2$$

where $$\alpha = \frac{2M}{M+1}.$$

M is the number of Fourier transforms used in computing the estimates, sometimes referred to as the time-bandwidth product of the estimates. In spectral analysis M is one half the number of degrees of freedom in each spectral estimate. Usually M is large enough to use a value for $\alpha$ of 2. Note that the formula differs from that for real variables, which would be $$\alpha = \frac{3M}{M+2},$$

resulting in a value for $\alpha$ of 3 for large values of M.

$C4(j)$ may be plotted directly, or plotted as $5\log|C4(j)|$ on the same scale as the power spectrum. Color coding may be used to indicate whether $C4(j)$ is positive or negative, and a third color may be used to identify the power spectrum.

$C4(j)$ may also be plotted on a linear scale, preferably normalized by first dividing by the square of the spectral power of the corresponding frequency:

$$C4_{NORM}(j) = \frac{\frac{1}{M}\sum_{k=1}^{M}|X_k(j)|^4}{S(j)^2} - \alpha$$

Fourth order cumulants may also be useful for detecting correlation between various frequency components, and are found by:

$$C4_\alpha(j,j') = \frac{1}{M}\sum_{k=1}^{M} X^*_k(j-\alpha)X_k(j)X_k(j')X^*_k(j'+\alpha) -$$

$$\left(\frac{1}{M}\sum_{k=1}^{M} X^*_k(j-\alpha)X_k(j)\right)\left(\frac{1}{M}\sum_{k=1}^{M} X_k(j')X^*_k(j'+\alpha) -\right.$$

$$\left(\frac{1}{M}\sum_{k=1}^{M} X^*_k(j-\alpha)X_k(j')\right)\left(\frac{1}{M}\sum_{k=1}^{M} X_k(j)X^*_k(j'+\alpha)\right)$$

Since the last two terms are usually zero, only the first term is normally calculated.

The quantity $5 \log(|C4_\alpha(j,j')|$ may be plotted on the same graph with the spectrum, and may also be normalized by:

$$C4_{\alpha(NORM)}(j,j') = \frac{C4_\alpha(j,j')}{\sqrt{S(j-\alpha)S(j)S(j')S(j'-\alpha)}}$$

Other modifications, variations, and applications of the present invention may be made in accordance with the above teachings other than as specifically described to practice the invention within the scope of the following claims.

I claim:

1. A method for measuring a frequency spectrum by complex cumulants comprising the steps of:

receiving an input signal having a frequency bandwidth and a power distribution from a signal source generating said input signal;

lowpass filtering said input signal;

digitizing said input signal at a sample rate appropriate to said frequency bandwidth of said input signal to form a series of digitized samples;

forming an input buffer from said series of digitized samples;

spectrum analyzing said input buffer to form a spectrum portion of a display buffer;

Fourier transforming said input buffer to form a series of complex frequency coefficients;

magnitude squaring said series of complex frequency coefficients to form a magnitude squared series;

integrating said magnitude squared series to form an integrated magnitude squared series;

squaring said integrated magnitude squared series to form a normalizing series;

computing a fourth power of said series of frequency coefficients to form a magnitude fourth power series;

integrating said magnitude fourth power series to form an integrated magnitude fourth power series;

forming complex cumulants from said integrated magnitude fourth power series and said normalizing series;

forming a cumulants portion of said display buffer from said complex cumulants; and displaying said display buffer as a plot of said spectrum portion and a plot of said cumulants portion.

2. The method of claim 1, wherein said step of forming complex cumulants further includes:

computing a Fourier transform $$X_k(j) = \sum_{i=0}^{N-1} b_k(i)e^{-\sqrt{-12\pi ij/N}},$$

where i is a time index of a data stream of buffered samples 118, j is a frequency index of Fourier coefficients X, N is a number of time samples, k is a sample index of a buffer from which samples comprising a sequence b are taken, said sequence b being representative of said series of digitized samples;

computing spectral estimates $$S(j) = \frac{1}{M}\sum_{k=1}^{M} X_k(j)^*X_k(j); \text{ and}$$

computing a complex cumulant $$C4(j) = \frac{1}{M}\sum_{k=1}^{M} |X_k(j)|^4 - \alpha S(j)^2$$

where $$\alpha = \frac{2M}{M+1}.$$

3. The method of claim 2, wherein said step of computing a Fourier transform further includes a window function.

4. The method of claim 1, wherein said step of forming complex cumulants further includes:

computing a Fourier transform $$X_k(j) = \sum_{i=0}^{N-1} b_k(i)e^{-\sqrt{-12\pi ij/N}},$$

wherein i is a time index of a data stream of buffered samples 118, j is frequency index of Fourier coefficients X, N is a number of time samples, k is a sample index of a buffer from which samples comprising a sequence b are taken, said sequence b being representative of said series of digitized samples;

computing spectral estimates $$S(j) = \frac{1}{M}\sum_{k=1}^{M} X_k(j)^*X_k(j); \text{ and}$$

computing fourth order cumulants $$C4_\alpha(j,j') = \frac{1}{M}\sum_{k=1}^{M} X^*_k(j-\alpha)X_k(j)X_k(j')X^*_k(j'+\alpha) -$$

$$\left(\frac{1}{M}\sum_{k=1}^{M} X^*_k(j-\alpha)X_k(j)\right)\left(\frac{1}{M}\sum_{k=1}^{M} X_k(j')X^*_k(j'+\alpha) -\right.$$

$$\left(\frac{1}{M}\sum_{k=1}^{M} X^*{}_k(j-\alpha)X_k(j')\right)\left(\frac{1}{M}\sum_{k=1}^{M} X_k(j)X^*{}_k(j'+\alpha)\right)$$

where $$\alpha = \frac{2M}{M+1}.$$

5. The method of claim 1, wherein said step of displaying said display buffer as a plot of said cumulants portion further includes plotting said complex cumulants on a linear scale, appropriately normalized by spectral power.

6. The method of claim 1, wherein said step of displaying said display buffer as a plot of said cumulants portion further includes plotting said complex cumulants on a logarithmic scale.

7. The method of claim 1, wherein said step of displaying said display buffer as a plot of said cumulants portion further includes color coding to indicate whether said complex cumulants has a positive or a negative value, and to distinguish said spectrum portion from said cumulants portion.

8. The method of claim 1, wherein said step of displaying said display buffer as a plot of said cumulants portion further includes plotting square roots of said complex cumulants on an identical scale with said spectrum portion.

9. The method of claim 1, wherein said step of displaying said display buffer as a plot of said complex cumulants portion further includes said step of normalizing said complex cumulants to emphasize non-Gaussian signal components.

10. The method of claim 9, wherein said step of normalizing said complex cumulants further includes subtracting said complex cumulants from said spectrum portion and dividing by squared spectral power.

11. An apparatus for measuring a frequency spectrum by complex cumulants comprising:

means for receiving an input signal having a frequency bandwidth and a power distribution from a signal source generating said input signal;

means for lowpass filtering said input signal;

means for digitizing said input signal at a sample rate appropriate to said frequency bandwidth of said input signal to form a series of digitized samples;

means for forming an input buffer from said series of digitized samples;

means for spectrum analyzing said input buffer to form a spectrum portion of a display buffer;

means for Fourier transforming said input buffer to form a series of complex frequency coefficients;

means for magnitude squaring said series of complex frequency coefficients to form a magnitude squared series;

means for integrating said magnitude squared series to form an integrated magnitude squared series;

means for squaring said integrated magnitude squared series to form a normalizing series;

means for computing a fourth power of said series of complex frequency coefficients to form a magnitude fourth power series;

means for integrating said magnitude fourth power series to form an integrated magnitude fourth power series;

means for forming complex cumulants from said integrated magnitude fourth power series and said normalizing series;

means for forming a cumulants portion of said display buffer from said complex cumulants; and means for displaying said display buffer as a plot of said spectrum portion and a plot of said cumulants portion.

12. The apparatus of claim 11, further including a signal source for providing said input signal.

* * * * *